(12) United States Patent
Teerlinck et al.

(10) Patent No.: US 6,863,795 B2
(45) Date of Patent: Mar. 8, 2005

(54) MULTI-STEP METHOD FOR METAL DEPOSITION

(75) Inventors: Ivo Teerlinck, Leuven (BE); Paul Mertens, Bonheiden (BE)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 0 days.

(21) Appl. No.: 10/105,027

(22) Filed: Mar. 21, 2002

(65) Prior Publication Data

US 2002/0175080 A1 Nov. 28, 2002

Related U.S. Application Data

(60) Provisional application No. 60/278,201, filed on Mar. 23, 2001.

(51) Int. Cl.[7] .............................. C25D 5/34; C25D 5/02; C25D 11/32; C25D 5/10; C23C 28/02

(52) U.S. Cl. .................. 205/210; 205/118; 205/123; 205/157; 205/170; 205/176; 205/182; 205/184

(58) Field of Search ................................. 205/118, 123, 205/157, 170, 176, 182, 184, 210

(56) References Cited

U.S. PATENT DOCUMENTS

| | | | | |
|---|---|---|---|---|
| 3,328,273 A | * | 6/1967 | Crentz et al. | 205/298 |
| 6,319,831 B1 | * | 11/2001 | Tsai et al. | 438/678 |
| 6,350,364 B1 | * | 2/2002 | Jang | 205/118 |
| 6,517,894 B1 | * | 2/2003 | Hongo et al. | 427/97 |
| 6,534,116 B2 | * | 3/2003 | Basol | 427/97 |

* cited by examiner

*Primary Examiner*—Edna Wong
(74) *Attorney, Agent, or Firm*—Knobbe Martens Olson & Bear LLP

(57) ABSTRACT

The invention is related to a method of plating of a metal layer on a substrate. The method is particularly preferred for the formation of metallization structures for integrated circuits.

19 Claims, 3 Drawing Sheets

MULTI-STEP METHOD FOR METAL DEPOSITION

This application claims the benefit of U.S. Provisional Application No. 60/278,201, filed Mar. 23, 2001.

FIELD OF THE INVENTION

The invention relates to a method of plating a metal layer on a substrate. This method is particularly preferred for the formation of metallization structures for integrated circuits.

BACKGROUND OF THE INVENTION

Recently, copper has been introduced in ULSI metallization schemes as a replacement for aluminum due to its lower resistivity and superior electromigration resistance. When copper is used as a conductive path, electrolytic deposition (plating) has emerged as the deposition method of choice for damascene copper interconnects. Electrolytic deposition of a metal, e.g., copper in the case of copper interconnects, is performed by bringing a surface, e.g., one side of a wafer, in contact with a solution containing the ions of the metal to be deposited and supplying electrons to these ions to deposit metal atoms on the surface by a reduction reaction. When the electrons for ion reduction are supplied from a reducing agent present in the solution, this electrolytic deposition process is referred to as electroless deposition. If, in the deposition process, the substrate is electrically connected to an external power supply to deliver electrons, this is referred to as electrodeposition. The substrate, electrically connected in such a way that the metal ions are reduced to metal atoms, is referred to as the cathode. Another electrically active surface, known as the anode, is also present in the electrolyte to complete the electrical circuit. At the anode, an oxidation reaction occurs that balances the current flow at the cathode, thus maintaining electrical neutrality in the solution. In the case of copper plating, cupric ions removed from the electrolyte at the wafer cathode are replaced by dissolution from a solid anode containing copper. The action of depositing the metal can be combined with the action of mechanical polishing in order to avoid the accumulation of deposited material.

In IC technology, the challenge arises in depositing copper into very high-aspect-ratio sub-micron openings such as trenches, vias, and holes without forming voids in the plated metal and wherein the plated metal possesses the appropriate materials properties with respect to, for example, grain size, impurity content, stress, electrical resistivity, roughness, hardness, and ductility. The ability to achieve this desired defect-free filling (also known as "superfilling" or "bottom-up fill") of sub-micron damascene structures by plating is largely dependent on the influence of additives, organic or inorganic in nature, or a combination, which are added to the plating bath containing the ions of the metal to be deposited (e.g., copper ions). State of the art commercial additive systems (e.g., additives for interconnect applications) generally include a combination of proprietary additives containing sulfur, nitrogen and/or oxygen functional groups. The additives can include brighteners, levelers, or carriers, as are known in the art. It is generally noted that the addition of halide ion, typically chloride or bromide, is preferred, if not necessary, to obtain good deposits.

A "bright deposit" is a deposit which has a highly reflective surface gloss, and brighteners are additives which, when added to a copper plating solution, improve the brightness of the deposit. Brightening is usually defined as the ability of a plating solution to produce fine deposits which consist of crystallites smaller than the wavelengths of visible light and having oriented grain structure. Additives acceptable for use as brighteners are well known in the art.

The term "leveled deposit" describes a deposit whose surface is smoother than that of its substrate. Thus, "leveling" denotes the ability of a plating bath to produce deposits relatively thicker in recesses and relatively thinner on protrusions, thereby decreasing the depth of surface irregularities (planarization). In the art of damascene interconnect technology, the filling/leveling of very high-aspect-ratio sub-micron features is usually referred to as "superfilling," "super conformal plating" or "bottom-up fill."

Brighteners and levelers may include sulfur and/or nitrogen containing molecules. Typically, sulfur containing compounds may include sulfonated or phosphonated organic sulfides such as, for example, 4,5-dithiaoctane-1,8-disulfonic acid, 3-mercaptopropylsulfonic acid, or their salts. These compounds give rise to a depolarization of metal ion discharge, such as copper ion discharge, hence, they may also be referred to as "depolarizers". A brightener or leveler can have a depolarizing effect. Another typical example of a depolarizer is thiourea or its derivatives, which, depending on its concentration, may have a polarizing or depolarizing effect on copper ion discharge. Nitrogen-containing molecules which may have a depolarizing effect include, for example, phthalocyanine compounds (e.g. Alcian Blue), or phenazine azo dyes (e.g. Janus Green B). Some such additives were found to act as brightener and leveler simultaneously.

Brighteners/levelers are usually used in combination with carriers (also referred to as "suppressors"). Suppressors are typically polymers containing polyether components, such as polyethylene glycol, polypropylene glycol, their block copolymers, polyether surfactants, or alkoxylated aromatic alcohols. Also, halide ions, such as chloride or bromide ion, are typically added to the plating bath. Carriers typically act by suppressing the electrolytic copper deposition, especially in combination with chloride or bromide ions, which affect the adsorption behavior of carriers and brighteners/levelers.

The synergistic effects between the additives results in local change and balance of acceleration and suppression of copper deposition and plays a central role in achieving the desired fill profiles for very high-aspect-ratio features. The additives also influence the materials properties of the deposit.

In state-of-the art plating, the depletion of the additives in the copper plating bath over time drastically complicates the manufacturability of the copper plating process. Especially problematic is the decomposition of the brightening/leveling compounds in a typical commercial electrolytic plating bath. These compounds are typically prone to decomposition at a high rate in solutions containing copper ions in contact with metallic copper. Thus, even when the electroplating solution is not in use but is left in contact with the copper-containing anode, the decomposition of the additive continues. Therefore, an appropriate electrolyte management system with precise and fast feedback control of the constituents of the plating solution is required to maintain the desired filling and materials properties of the deposit. Such a management system necessitates the application of on-line and real-time analysis of the plating electrolyte, e.g., by cyclic voltammetric stripping, and continuous feedback control of the electrolyte composition by dosing and spiking of additives. The concentration of the additives can be controlled this way. However, a continuous accumulation of decomposition products and impurities still occurs in the plating bath, affecting the filling and materials properties of the deposit.

Another problem encountered in state-of-the-art plating is the formation of bumps of deposited material on top of recessed areas. This is believed to be due to the accumulation of compounds which have a depolarizing effect on the metal ion discharge (depolarizers).

Several methods may be used to overcome or at least reduce the extent of this problem. In one method, after filling of the recess, a deplating step is performed to redistribute the adsorbed species over the surface. After deplating, the remaining portion of the layer is deposited. Another method is to perform a thermal anneal after filling the recess to desorb the additives from the surface. After this thermal anneal, the remaining portion of the material is deposited. Another method to reduce bump formation is to apply mechanical polishing simultaneously with the action of deposition.

U.S. Pat. No. 6,319,831 describes a method for depositing copper in high aspect ratio contact/via openings in integrated circuits. The copper is deposited from a copper plating electrolyte containing brighteners and levelers. The first copper layer is plated at low current density. Since the concentration of the brightener decreases in the base regions of the openings, the brightener is replenished in these regions while the current is stopped. In a subsequent step, a high current is applied during copper deposition.

SUMMARY OF THE INVENTION

An improved method for depositing a metal layer on a surface of a substrate without the problems of depletion and monitoring of additives is desirable. A method to reduce the problem of bump-formation and void formation in ULSI metallization is also desirable.

In a first embodiment, a method for depositing a metal layer including a metal on a surface of a substrate is provided, the method including the steps of: exposing the substrate to a first solution, the first solution including a depolarizing compound, wherein the first solution is substantially free of ions of the metal; and thereafter exposing the substrate to a second solution while applying a current between the substrate and an anode, the second solution including an ion of the metal.

In an aspect of the first embodiment, the metal includes copper, gold, silver, aluminum, platinum, nickel, chromium, zinc, and alloys and mixtures thereof. The metal may be copper. The metal may also be an alloy, the alloy including two or more alloyed metals selected from the group consisting of copper, gold, silver, aluminum, platinum, nickel, chromium, and zinc, and wherein the ion of the metal includes the ions of the two or more alloyed metals. The alloy may be copper.

In an aspect of the first embodiment, the depolarizing compound is a brightening compound or a leveling compound. The depolarizing compound may be an organic sulfide. The depolarizing compound may also have the chemical formula:

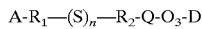

wherein $R_1$ and $R_2$ are alkylene groups, A is a moiety selected from the group consisting of hydrogen, sulfonate, phosphonate, an alkaline metal sulfonate, an alkaline metal phosphonate, an ammonium salt of a sulfonate, an ammonium salt of a phosphonate, an acid of a sulfonate, an acid of a phosphonate, and an alkali metal, n is an integer from 1 to 3, D includes hydrogen, a Group I metal ion, a Group II metal ion, and an ammonium ion, and Q is sulfur or phosphorus.

The depolarizing compound may also include a compound including $HO_3P—(CH_2)_3—S—S—(CH_2)_3—PO_3H$, $HO_3S—(CH_2)_4—S—S—(CH_2)_4—SO_3H$, $NaO_3S—(CH_2)_3—S—S—S—S—(CH_2)_3—SO_3Na$, $HO_3S—(CH_2)_2—S—S—(CH_2)_2—SO_3H$, $CH_3—S—S—CH_2—SO_3H$, $HS—(CH_2)_3—SO_3H$, and mixtures thereof.

In an aspect of the first embodiment, during the step of exposing the substrate to the first solution essentially no current is applied between the substrate and an anode. In another aspect of the first embodiment, during the step of exposing the substrate to the first solution, a current is applied between the substrate and an anode.

In an aspect of the first embodiment, the first solution may include a halide ion. The first solution may include a pH adjuster.

In an aspect of the first embodiment, the second solution is substantially free of depolarizing compounds. Alternatively, the second solution may include a depolarizing compound. The second solution may include a halide ion.

In an aspect of the first embodiment, the step of exposing the substrate to a first solution and the step of exposing the substrate to a second solution are repeated.

In an aspect of the first embodiment, the method further includes the step of polishing the substrate.

In a second embodiment, a method for depositing a metal layer including a metal on a surface of a substrate is provided, the method including the steps of: providing a substrate having a surface, wherein the substrate is a semiconducting substrate and wherein the surface includes an insulating layer; creating an opening in the insulating layer; forming a barrier layer on a sidewall and on a bottom of the opening; forming a copper seed layer on the barrier layer; and thereafter exposing the substrate to a first solution, the first solution including a depolarizing compound, wherein the first solution is substantially free of ions of the metal; and thereafter exposing the substrate to a second solution while applying a current between the substrate and an anode, the second solution including an ion of the metal, repeating the steps of exposing the substrate to a first solution and exposing the substrate to a second solution until the opening is filled with the metal.

In an aspect of the second embodiment, the metal includes copper, gold, silver, aluminum, platinum, nickel, chromium, zinc, and alloys and mixtures thereof. The metal may be copper. The metal may also be an alloy, the alloy including two or more alloyed metals selected from the group consisting of copper, gold, silver, aluminum, platinum, nickel, chromium, and zinc, and wherein the ion of the metal includes the ions of the two or more alloyed metals. The alloy may be copper.

In an aspect of the second embodiment, the depolarizing compound is a brightening compound or a leveling compound. The depolarizing compound may be an organic sulfide. The depolarizing compound may also have the chemical formula:

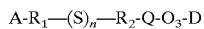

wherein $R_1$ and $R_2$ are alkylene groups, A is a moiety selected from the group consisting of hydrogen, sulfonate, phosphonate, an alkaline metal sulfonate, an alkaline metal phosphonate, an ammonium salt of a sulfonate, an ammonium salt of a phosphonate, an acid of a sulfonate, an acid of a phosphonate, and an alkali metal, n is an integer from 1 to 3, D includes hydrogen, a Group I metal ion, a Group II metal ion, and an ammonium ion, and Q is sulfur or phosphorus.

The depolarizing compound may also include a compound including $HO_3P—(CH_2)_3—S—S—(CH_2)_3—PO_3H$, $HO_3S—(CH_2)_4—S—S—(CH_2)_4—SO_3H$, $NaO_3S—(CH_2)_3—S—4S—(CH_2)_3—SO_3Na$, $HO_3S—(CH_2)_2—S—S—(CH_2)_2—SO_3H$, $CH_3—S—S—CH_2—SO_3H$, $HS—(CH_2)_3—SO_3H$, and mixtures thereof.

In an aspect of the second embodiment, during the step of exposing the substrate to the first solution essentially no current is applied between the substrate and an anode. In another aspect of the second embodiment, during the step of exposing the substrate to the first solution, a current is applied between the substrate and an anode.

In an aspect of the second embodiment, the first solution may include a halide ion. The first solution may include a pH adjuster.

In an aspect of the second embodiment, the second solution is substantially free of depolarizing compounds. Alternatively, the second solution may include a depolarizing compound. The second solution may include a halide ion.

In an aspect of the second embodiment, the method further includes the step of polishing the substrate.

DETAILED DESCRIPTION OF THE PREFERRED EMBODIMENT

Figure 1:
FIG. 1 is a FIB-SEM image of a cross section of 0.3 μm wide trenches prepared according to Example 1, wherein the copper was electrodeposited on a copper seed layer by immersion in the second Solution 2 only.

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The preferred embodiments are related to the field of plating a metal layer on a substrate. This preferred embodiments are not limited to the deposition of metal layers on integrated circuits, but can be applied to a broader range of applications wherein metal layers are deposited on a substrate.

In a first aspect of a preferred embodiment, a process for depositing a metal layer on at least one surface of a substrate is provided comprising the steps of exposing said substrate to a first solution wherein said first solution comprises a depolarizing compound and wherein said first solution is substantially free of the ions of said metal, and exposing said substrate to a second solution while applying a current between said substrate and an anode, wherein said second solution comprises the ions of said metal.

Preferably, said step of exposing said substrate to a second solution is performed after the step of exposing said substrate to a first solution.

For the purpose of the preferred embodiments, the term "solution" is understood to include, but not be limited to, a vapor, mist, fluid, or liquid.

Said substrate can include a material such as a semiconducting material, glass, quartz, a ceramic material, polymeric material, or combinations thereof. Said substrate can be a flat substrate or can be a flexible substrate. When the substrate is made of a semiconducting material, the substrate can be a substrate subjected to the process of integrated circuit fabrication, and particularly to the process of integrated circuit metallization, such as damascene processing. The surface of the substrate can comprise an insulating layer and the insulating layer can comprise very high-aspect-ratio sub-micron openings such as trenches, vias, or contact holes. The opening can be covered with a barrier layer including, but not limited to, TiN or TaN. A thin metallic layer, also called a "seedlayer," can be formed on the opening or on the barrier layer.

The metal layer formed on the substrate can be a metal selected from the group consisting of copper, gold, silver, aluminum, platinum, chromium, zinc, or nickel. Preferably, said metal is copper. The metal can also be an alloy of at least two metals. The metals of the alloy can be selected from the group consisting of copper, gold, silver, aluminum, platinum, chromium, zinc, or nickel. The ions in said first solution are then the ions of the metals forming the alloy.

This process can result in a defect-free filling of surface topography, including, but not limited to, damascene interconnect. Performing the deposition this way drastically reduces the need for intensive monitoring and dosing of the second plating fluid.

The process as described in this first aspect of the preferred embodiments can comprise at least two steps.

In a first step, the substrate is exposed to a first solution comprising a depolarizing compound. A depolarizing compound is a compound that accelerates the deposition of the metal layer. A depolarizing compound can include, but is not limited to, a brightening compound or a leveling compound. A depolarizing compound can also be a compound having the properties of both a brightening compound and a leveling compound. The terms "brightener" and "leveler" are technical terms known by a person skilled in the art.

Depolarizing compounds may include chemical compounds comprising at least one sulfur-containing group. Said depolarizing compound can also be an organic sulfide.

Suitable depolarizing compounds may include, but are not limited to, chemical compounds with the formula:

$A-R_1—(S)_n—R_2-Q-O_3-D$

In the above formula, $R_1$ and $R_2$ are alkylene groups having from about 1 to about 10 carbon atoms, and preferably 1 to 6 carbon atoms. A is selected from the group consisting of hydrogen, sulfonate, phosphonate, an alkaline metal sulfonate, an alkaline metal phosphonate, an ammonium salt of sulfonate, an ammonium salt of a phosphonate, an acid of a sulfonate, an acid of a phosphonate, or an alkali. The variable n is an integer from 1 to 3, namely, 1, 2, or 3. D is selected from the group consisting of H, a Group I or Group II metal ion or an ammonium ion. Q is selected from sulfur or phosphorus.

More particularly, the depolarizing compound can be a compound selected from the group:

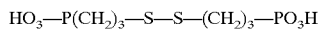

$HO_3—P(CH_2)_3—S—S—(CH_2)_3—PO_3H$

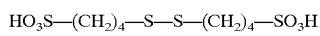

$HO_3S—(CH_2)_4—S—S—(CH_2)_4—SO_3H$

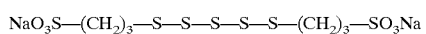

$NaO_3S—(CH_2)_3—S—S—S—S—S—(CH_2)_3—SO_3Na$

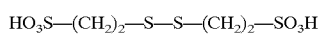

$HO_3S—(CH_2)_2—S—S—(CH_2)_2—SO_3H$

Another depolarizing compound is HS—$(CH_2)_3$—$SO_3H$.

Preferably, said depolarizing compound is selected from the group consisting of HS—$(CH_2)_3$—$SO_3H$, $HO_3S$—$(CH_2)_3$—S—S—$(CH_2)_3$—$SO_3H$, $CH_3$—S—S—$CH_2$—$SO_3H$, $CH_3$—S—S—S—$(CH_2)_4$—$SO_3H$, $HO_3S$—$CH_2$—S—S—S—S—$CH_2$—$SO_3H$, $(CH_3)_2CHCH_2$—S—S—$CH_2CH(CH_3)_2$, $(CH_3)_3C$—S—S—$C(CH_3)_2SO_3H$, $HO_3S$—$(CH_2)_4$—S—S—$(CH_2)_4$—$SO_3H$, as well as the phosphonic derivatives.

The first solution is substantially free of metal ions, and more specific the metal ions accounting for the deposition of the metal layer on the substrate. An accumulation of decomposition products and impurities in the plating bath (which may affect the filling and materials properties) may be avoided. Since the first solution is substantially free of metal ions, substantially no metal layer is deposited on the substrate from this solution. As a result, the depolarizing compound can adsorb on the substrate surface, more specifically at the interface between the surface of the substrate and the liquid.

In the second step, the substrate is exposed to a second solution while a current is applied between the substrate and an anode. Said second solution comprises at least the metal ions, such that a metal layer is deposited on the substrate. A depolarizing compound can be present, but the amount in the total second solution is preferably sufficiently low such that the decomposition of components of the solution has no influence on the quality of the deposited layer. Preferably, the second solution is initially substantially free of depolarizing compounds. During the second step, the adsorbed depolarizing compound remains adsorbed at the surface of the growing metal deposit and retains its depolarizing behavior. When high aspect ratio openings are to be filled, the surface concentration of the adsorbed depolarizing species at the concave corners of the openings increases as compared to the other portions of the feature. Due to the depolarizing effect, the deposition rate is enhanced at the concave corners. Improved filling of the openings arises from an accumulation of adsorbed depolarizing species brought about by a decreasing interface area at concave sites. This deposition behavior results in improved filling if sufficient rate differentiation exists between polarized and depolarized portions of the profile. The adsorption of polarizing and depolarizing species is such that the changing interface area can induce sufficient Cu deposition rate differentiation between more and less inhibited areas to achieve superfilling.

A low amount of depolarizing compound may be present in the second solution.

The first solution can further comprise a pH adjuster, for example, $H_2SO_4$, $HBF_4$, $H_3BO_3$, HCl, $HNO_3$, $NH_3$, or oxalic acid.

The first solution as described can also comprise halide ions, for example chloride or bromide.

In a further embodiment, the first solution can also comprise other additives for copper plating baths, for example polyether compounds, phthalocyanine compounds, or phenazine azo dyes.

Moreover, the solution may further comprise compounds that are typically present in plating baths. The compounds may be present in such a concentration that their presence preferably does not enhance the decomposition of the compounds present in the first fluid.

The first solution can also comprise metal ions of the metal to be deposited. When the first solution comprises simultaneously a liquid and metallic copper, e.g. a copper containing anode, the first solution preferably does not contain ions of the metal, e.g., Cu ions.

In a further embodiment, the first solution as described in the previous embodiments can be applied under open circuit conditions. This means that no current or voltage is applied to the solution.

In a further embodiment, the first solution as described in the previous embodiments can also be applied by applying a current or potential to the surface. Preferably, an inert electrode is used as the anode. For the purpose of this disclosure, the term "inert" means that the electrode does not deliver the metal ion to be deposited. For example, in case of copper deposition, a copper anode may be avoided in the first step of the plating process.

Also a combination of both modes (namely, open circuit conditions and applying a current) of operation can be used.

Preferably, the first solution is substantially free of metal ions to be deposited during the plating process.

In a second step the wafer is exposed to a second solution. The second solution comprises at least the metal ions to be deposited. Said metal ions can include, but are not limited to, copper ions.

The second solution can also comprise a pH adjuster, for example $H_2SO_4$. The second solution as described in any of the previous embodiments may also comprise halide ions, for example, chloride or bromide. Furthermore, the second solution may also contain a depolarizing compound. The amount of the depolarizing compound in the solution must be such that the stability of the solution is maintained.

In a further embodiment, the second solution as described in any of the previous embodiments may also comprise other additives for copper plating baths, for example polyether compounds, phthalocyanine compounds, or phenazine azo dyes.

In a further embodiment, the second solution as described in any of the previous embodiments can also comprise a brightening or leveling species. The concentration of the brightening or leveling species must be chosen such that substantially no decrease of the stability of the plating bath is observed. Preferably, this solution does not need to contain the brightening/leveling species which have been adsorbed on the surface in the preceding step.

Said first step and said second step can be repeated for a number of times.

Said first step can be followed by an additional polishing step before executing step 2.

Said second step can also comprise a polishing step, such as polishing with an abrasive, a polishing pad or a scrubber. For example, the plating solution can be applied while the polishing occurs. The aim of the polishing step is to remove adsorbed species from the up-features. The term "up-features" refers to parts of the deposited copper layer having an increased height compared to other parts of the deposited copper layer.

It is apparent to one skilled in the art that in addition to the steps described above, more steps can be added to further improve filling and materials properties of the deposit. Also rinsing and drying steps may be incorporated.

A method for depositing a metal layer on a substrate is disclosed. Said substrate comprises at least one opening. Said substrate is preferably a semiconducting substrate. Said method comprises the steps of:

providing a substrate with an insulating layer;

creating an opening in said insulating layer;

forming a barrier layer on the sidewalls and the bottom of said opening;

forming a copper seed layer on said barrier layer;

exposing said substrate to a first solution, said first solution comprising at least a depolarizing compound and said first solution being substantially free of said metal ions;

exposing said substrate to a second solution while applying a current between the substrate and an anode, said second solution comprising at least copper ion; and repeating the steps of exposing said substrate to a first solution and exposing said substrate to a second solution second solution for a number of times until the openings are filled with the metal.

By using the two-step process of preferred embodiments, it is possible to deposit the metal layer from a solution which would otherwise not be suitable for deposition into very high-aspect-ratio sub-micron features without voids forming in the plated deposit.

Since the depolarizing compound is either not present, or is present in much lower amounts in the second solution from which the copper deposition is carried out, this also results in no accumulation, or much lower accumulation of impurities and decomposition products in the plating bath, which is very advantageous in terms of the filling and materials properties of the deposit.

In a second aspect of the preferred embodiments, an apparatus is disclosed for carrying out the electrolytic deposition process as described in the first aspect of the preferred embodiments. Said apparatus is for electrolytic deposition or electrochemical mechanical deposition. Said apparatus comprises at least one chamber.

In an embodiment, said apparatus comprises two separate chambers. In a first chamber comprising the first solution, the workpiece, e.g. the surface of the wafer, is exposed to the first solution. In a separate second chamber containing the second solution, the workpiece, e.g., the surface of the wafer, is exposed to the second solution.

In a further embodiment, said apparatus comprises one chamber. First, the workpiece, e.g., the surface of the wafer, is exposed to the first solution in the chamber. Then the first solution in said chamber is replaced by the second solution and the workpiece, e.g., the surface of the wafer, is exposed to the second solution in the chamber.

In a further embodiment, the step of exposing the workpiece, e.g., the surface of the wafer, to the solution, in any of the steps, can also comprise contact between the workpiece and a pad. A pad can be used as is known in the art, for example, in chemical and/or mechanical polishing. The pad is preferably one that is made of a non-conductive, porous type material such as polyurethane. The contact between the workpiece and the pad can also comprise the relative movement of the pad to the workpiece. The action of exposing the workpiece to the solution in any of the steps, can also comprise the action of mechanical polishing of the workpiece.

In a further embodiment, wherein the first solution is equivalent to the second solution, the deposition can be carried out in one chamber.

EXAMPLES

Damascene deposition in high-aspect-ratio sub-micron features was conducted. Using lithographic and etch steps, damascene structures were defined in an insulator deposited on a silicon wafer surface. Then, using physical vapor deposition, a TaN barrier layer was deposited followed by the deposition of a copper seed layer. The next two examples describe the deposition of copper into these damascene structures, according to the preferred embodiments.

Example 1

Figure 2:
FIG. 2 is a FIB-SEM image of a cross section of 0.3 μm wide trenches prepared according to Example 1 wherein the copper was electrodeposited on a copper seed layer by immersion in the second Solution 2, wherein the step was preceded by immersion in the first Solution 1.

The wafer surface was immersed in an aqueous solution containing 1 mg/l of the alkali metal salt of a sulfonated organic disulfide, i.e., $NaO_3S-(CH_2)_3-S-S-(CH_2)_3-SO_3Na$ (Solution 1) and subsequently the wafer surface was dried. The immersion was done under open-circuit conditions in the absence of an anode. Subsequently, the same wafer surface was immersed in a solution to perform the electrodeposition. This solution contained 70 g/l $CuSO_4.5H_2O$, 175 g/l $H_2SO_4$, 50 mg/l HCl, and 100 mg/l polypropylene glycol with an average molecular weight of 725 (Solution 2). The copper was deposited on the wafer surface by galvanostatic electrodeposition (10 mA/cm$^2$). FIG. 1 shows a FIB-SEM image of a cross section of 0.3 μm wide trenches wherein the copper was electrodeposited on the copper seed layer from Solution 2 without the preceding step of immersion in Solution 1. This process results in a very rough copper surface with voids in the trenches inappropriate for damascene copper interconnects. FIG. 2 shows a FIB-SEM image of a cross-section of 0.3 μm wide trenches wherein the electrodeposition in Solution 2 was preceded by immersion of the wafer in Solution 1. The images indicate that the step of immersion in Solution 1 comprising a brightening/leveling additive, followed by the step of electrodeposition in Solution 2, not comprising the brightener/leveler, results in superior filling characteristics and a smooth surface as required for copper damascene plating.

Example 2

Figure 3:
FIG. 3 shows a cross-section FIB-SEM image of copper-filled 0.3 μm wide trenches prepared according to Example 2.

The wafer surface was first immersed in a solution containing 1 mg/l of the alkali metal salt of a sulfonated organic disulfide, i.e., $NaO_3S-(CH_2)_3-S-S-(CH_2)_3-SO_3Na$, 70 g/l $CuSO_4.5H_2O$, 175 g/l $H_2SO_4$, 50 mg/l HCl and 100 mg/l polypropylene glycol with an average molecular weight of 725 (Solution 3). Subsequently, the wafer was dried. The immersion was done under open-circuit conditions in the absence of a copper-containing anode. Subsequently, the surface was immersed in a solution containing 70 g/l $CuSO_4.5H_2O$, 175 g/l $H_2SO_4$, 50 mg/l HCl and 100 mg/l polypropylene glycol with an average molecular weight of 725 (Solution 2). In this solution copper was deposited by galvanostatic electrodeposition (10 mA/cm$^2$). FIG. 3 shows a cross-section FIB-SEM image of copper-filled 0.3 μm wide trenches. The images again demonstrate that the step of immersion in Solution 3 under open-circuit conditions, followed by electrodeposition in Solution 2 results in superior filling characteristics and a smooth surface as required for copper damascene plating.

Carrying out the copper deposition process in consecutive steps as illustrated above dramatically improves the manufacturability of the deposition process. Since the brightening/leveling compound is absent in Solution 2, in which the electrolytic deposition is carried out, it is not necessary to continuously monitor and dose this compound in this solution. Solution 1 and 3 are not prone to decomposition and build up of decomposition products and impurities, or at least prone to such processes at appreciably much lower rates.

In summary, the deposition process, which in state-of-the-art plating is carried out in a single solution containing all necessary additives to obtain the desired deposit properties, the additives requiring appropriate solution management, is separated into a multi-step deposition process using consecutive steps which either do not need intensive control, or need control to a much lower extent. In addition, carrying out the deposition in separate steps dramatically reduces the incorporation of decomposition products and impurities in the deposit.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. All patents, applications, and other references cited herein are hereby incorporated by reference in their entirety.

What is claimed is:

1. A method for depositing a metal layer comprising a metal on a surface of a substrate, the method comprising the steps of:
   exposing said substrate to a first solution, said first solution comprising a depolarizing compound, wherein said first solution is substantially free of ions of said metal, whereby said depolarizing compound is deposited on said substrate while substantially no metal is deposited on said substrate; and
   thereafter exposing said substrate to a second solution while applying a current between said substrate and an anode, said second solution comprising an ion of said metal, whereby said metal is deposited on said substrate.

2. The method as recited in claim 1, wherein said metal is selected from the group consisting of copper, gold, silver, aluminum, platinum, nickel, chromium, zinc, and alloys and mixtures thereof.

3. The method as recited in claim 1, wherein said metal is copper.

4. The method as recited in claim 1, wherein said metal is an alloy, the alloy comprising two or more alloyed metals selected from the group consisting of copper, gold, silver, aluminum, platinum, nickel, chromium, and zinc, and wherein said ion of said metal comprises the ions of said two or more alloyed metals.

5. The method as recited in claim 4, wherein said alloy comprises copper.

6. The method as recited in claim 1, wherein said depolarizing compound is a brightening compound or a leveling compound.

7. The method as recited in claim 6, wherein said depolarizing compound is an organic sulfide.

8. The method as recited in claim 1, wherein said depolarizing compound has the chemical formula:

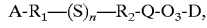

$$A\text{-}R_1\text{—}(S)_n\text{—}R_2\text{-}Q\text{-}O_3\text{-}D,$$

wherein $R_1$ and $R_2$ are alkylene groups,

A is a moiety selected from the group consisting of hydrogen, sulfonate, phosphonate, an alkaline metal sulfonate, an alkaline metal phosphonate, an ammonium salt of a sulfonate, an ammonium salt of a phosphonate, an acid of a sulfonate, an acid of a phosphonate, and an alkali metal, n is an integer from 1 to 3, D is selected from the group consisting of hydrogen, a Group I metal ion, a Group II metal ion, and an ammonium ion, and Q is sulfur or phosphorus.

9. The method as recited in claim 1, wherein said depolarizing compound comprises a compound selected from the group consisting of $HO_3P\text{—}(CH_2)_3\text{—}S\text{—}S\text{—}(CH_2)_3\text{—}PO_3H$, $HO_3S\text{—}(CH_2)_4\text{—}S\text{—}S\text{—}(CH_2)_4\text{—}SO_3H$, $NaO_3S\text{—}(CH_2)_3\text{—}S\text{—}S\text{—}S\text{—}S\text{—}(CH_2)_3\text{—}SO_3Na$, $HO_3S\text{—}(CH_2)_2\text{—}S\text{—}S\text{—}(CH_2)_2\text{—}SO_3H$, $CH_3\text{—}S\text{—}S\text{—}CH_2\text{—}SO_3H$, $HS\text{—}(CH_2)_3\text{—}SO_3H$, and mixtures thereof.

10. The method as recited in claim 1, wherein during said step of exposing said substrate to said first solution essentially no current is applied between the substrate and the anode.

11. The method as recited in claim 1, wherein during said step of exposing said substrate to said first solution, a current is applied between the substrate and the anode.

12. The method as recited in claim 1, wherein said first solution comprises a halide ion.

13. The method as recited in claim 1, wherein said first solution comprises a pH adjuster.

14. The method as recited in claim 1, wherein said second solution is substantially free of depolarizing compounds.

15. The method as recited in claim 1, wherein said second solution comprises a depolarizing compound.

16. The method as recited in claim 1, wherein said second solution comprises a halide ion.

17. The method as recited in claim 1, wherein said step of exposing said substrate to a first solution and said step of exposing said substrate to a second solution are repeated.

18. The method as recited in claim 1, further comprising the step of polishing said substrate.

19. A method for depositing a metal, said method comprising the steps of:
   providing a substrate having a surface, wherein said substrate is a semiconducting substrate and wherein said surface comprises an insulating layer;
   creating an opening in said insulating layer;
   forming a barrier layer on a sidewall and on a bottom of said opening;
   forming a copper seed layer on said barrier layer; thereafter
   exposing said substrate to a first solution, said first solution comprising a depolarizing compound, wherein said first solution is substantially free of ions of said metal, whereby said depolarizing compound is deposited on said substrate while substantially no metal is deposited on said substrate; thereafter
   exposing said substrate to a second solution while applying a current between said substrate and an anode, said second solution comprising an ion of said metal, whereby said metal is deposited on said substrate; and
   repeating the steps of exposing said substrate to a first solution and exposing said substrate to a second solution until the opening is filled with said metal.

* * * * *